United States Patent [19]
Chen

[11] Patent Number: 6,136,515
[45] Date of Patent: Oct. 24, 2000

[54] METHOD FOR REMOVING PHOTORESIST IN METALLIZATION PROCESS

[75] Inventor: Hui-Ming Chen, Miao-Li Hsien, Taiwan

[73] Assignee: United Integrated Circuits Corp., Hsinchu, Taiwan

[21] Appl. No.: 09/136,629

[22] Filed: Aug. 19, 1998

[30] Foreign Application Priority Data

Jun. 30, 1998 [TW] Taiwan ................................ 87110516

[51] Int. Cl.⁷ .................................................... G03F 7/40
[52] U.S. Cl. ......................... 430/330; 430/313; 430/318
[58] Field of Search .................................. 430/313, 318, 430/330

[56] References Cited

U.S. PATENT DOCUMENTS 4,963,510  10/1990  Roane ..................................... 437/192
5,533,635  7/1996  Man ......................................... 216/67
5,714,036  2/1998  Wong ................................... 156/626.1
5,840,203  11/1998  Peng ........................................ 216/66

*Primary Examiner*—Kathleen Duda
*Assistant Examiner*—Nicole Barreca
*Attorney, Agent, or Firm*—Thomas, Kayden, Horstemeyer & Risley

[57] ABSTRACT

A method for removing photoresist in a metallization process according to the invention is able to completely remove a photoresist residue remaining on the surface of a metal layer and avoids corrosion of the metal layer. In the method, a heat treatment is performed after patterning the metal layer and before removing the photoresist layer, thereby removing materials which corrode the metal layer. Therefore, corrosion to the metal layer is prevented. Next, the photoresist layer is removed by a wet strip process instead of an oxygen plasma process. As a result, the photoresist residue remaining on the surface of the metal layer cannot be oxidized into an insoluble oxide and can be completely removed.

11 Claims, 1 Drawing Sheet

METHOD FOR REMOVING PHOTORESIST IN METALLIZATION PROCESS

CROSS-REFERENCE TO RELATED APPLICATION

This application claims the priority benefit of Taiwan application serial no. 87110516, filed Jun. 30, 1998, the full disclosure of which is incorporated herein by reference.

BACKGROUND OF THE INVENTION

1. Field of the Invention

The invention relates to a method for removing photoresist in a metallization process, and in particular to a method which can completely remove photoresist residue remaining on the surface of a metal layer and avoids corrosion of the metal layer in the metallization process.

2. Description of the Related Art

A method for patterning a metal layer according to the prior art is completed by using photolithography to form a photoresist layer on a metal layer, etching the metal layer toward the photoresist layer and removing the photoresist layer. In this method, there are two main factors which affect the quality of the pattered metal layer. One is that a photoresist residue easily remains on the surface of the metal layer, the other is that the metal layer is corroded. These two factors will be described in detail hereinafter.

As can be seen from the above, the photoresist residue easily remains on the exposed surface of the metal layer in a process of etching the metal layer covered with the photoresist layer before removing the photoresist layer. Since the residue is a macromolecular polymer, it has to be removed.

Furthermore, the metal etching is performed by use of a halide plasma. After etching the metal layer, a metal halide is produced on the exposed surface of the metal layer while halogen ions exist in the remaining photoresist. The halide and halogen ions typically cause metal corrosion.

Now, taking an aluminum alloy layer as an example, the aluminum alloy layer is etched by use of chloride plasma and/or bromide plasma. After etching, $AlCl_3$ and/or $BrCl_3$ not exhausted by a vacuum system or chlorine and/or bromine remain(s) on the surface of the aluminum alloy layer. If the residues are not removed, water molecules in the air react with the remaining chlorine or chloride to generate hydrogen chloride (HCl) or with the remained bromine or bromide to generate hydrogen bromide (HBr) after taking the chip out of a RIE reactor.

Furthermore, the HCl formed on the surface of the aluminum alloy layer due to the water molecules in the air reacts with aluminum to generate an $AlCl_3$ layer. Then, the $AlCl_3$ layer reacts with the water molecules again. The above-mentioned reactions continuously repeat and corrode the aluminum alloy layer. On the other hand, HBr can also react with aluminum to corrode the aluminum alloy layer. Moreover, if the photoresist is directly removed by a wet strip process without removing the residues, the water involved in the wet strip process can lead to production of HCL and/or HBr, which then corrodes the aluminum alloy layer.

In order to prevent corrosion of the metal, a previous step is taken in which the photoresist is removed by performing a dry strip process with an $O_2$ plasma. This avoids subsequent metal corrosion caused by halogen ions existing in the photoresist. Thereafter, the photoresist residue remaining on the surface of the metal layer is removed by performing a wet strip process. However, if the $O_2$ plasma is used for a dry strip process, the photoresist residue oxidizes and becomes an insoluble oxide, such that the photoresist residue cannot be easily removed in the subsequent wet strip process.

SUMMARY OF THE INVENTION

In view of the above, a first object of the invention is to provide a method for removing photoresist in a metallization process, which is able to completely remove a photoresist residue remaining on the surface of a metal layer.

Furthermore, a second object of the invention is to provide a method for removing photoresist in a metallization process, which can completely avoid corrosion of the metal layer.

To attain the objects stated above, a method for removing photoresist in metallization process according to the invention is disclosed. In the method, a heat treatment is performed after patterning a metal layer and before removing a photoresist layer, to remove all materials which corrode the metal layer. Therefore, corrosion to the metal layer is prevented. Next, the photoresist layer is removed by a wet strip process instead of an oxygen plasma process. As a result, a photoresist residue remaining on the surface of the metal layer cannot oxidize into an insoluble oxide and can be completely removed.

BRIEF DESCRIPTION OF THE DRAWINGS

The present invention will be more fully understood from the detailed description given hereinbelow and the accompanying drawings which are given by way of illustration only, and thus are not limiting of the present invention, and wherein.

DETAILED DESCRIPTION OF THE EMBODIMENT

Figure 1A:
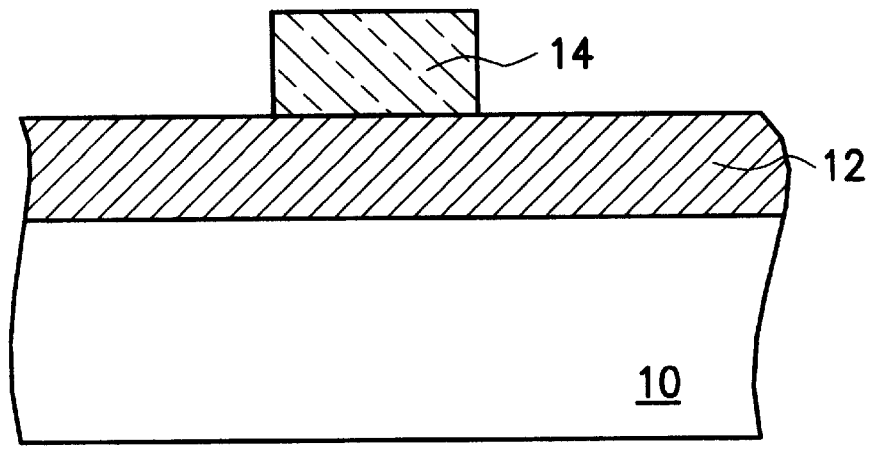
FIGS. 1A–1C are cross-sectional views showing a method for removing photoresist in a metallization process according to a preferred embodiment of the invention.

Referring to FIG. 1A, a metal layer 12 is formed on a semiconductor substrate 10 on which at least one MOS device is already formed. Then, a patterned photoresist layer 14 is formed on the metal layer 12.

Figure 1B:
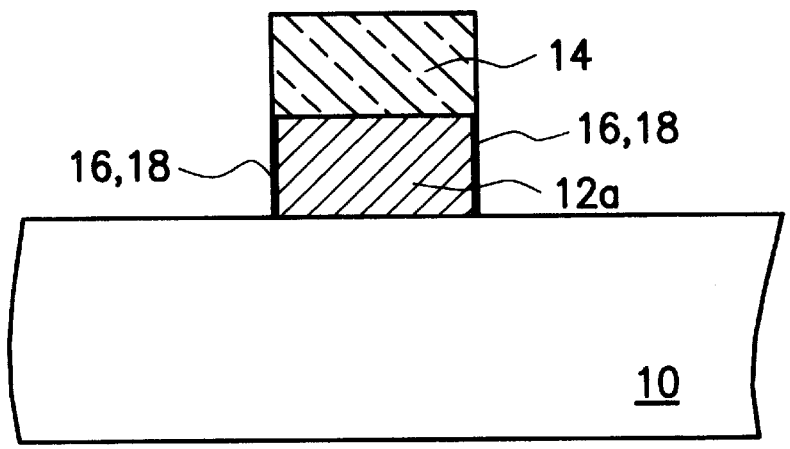

Referring to FIG. 1B, the metal layer 12 covered with the patterned photoresist layer 14 is etched by performing a dry etching process with a halide plasma, thereby forming a metal layer 12a. An etchant used in the dry etching process is a halide, such as chloride or bromide. After etching, halogen ions exist inside the photoresist layer 14 while a metal halide 16 and a photoresist residue 18 not removed by a vacuum system remain on the exposed surface of the metal layer 12a.

The halogen ions existing inside the photoresist 14 and the metal halide 16 remaining on the surface of the metal layer 12a are easily changed into a hydrogen halide in an environment containing moisture, wherein the hydrogen halide can corrode the metal layer 12a. Therefore, the invention includes an earlier step in which a heat treatment process is performed in an oven or on a hot plate at a temperature of about 120–150° C., thereby removing the halogen ions and the metal halide 16 from the photoresist layer 14 and the surface of the metal layer 12a, respectively, before exposing the entire chip to an environment containing moisture.

Figure 1C:
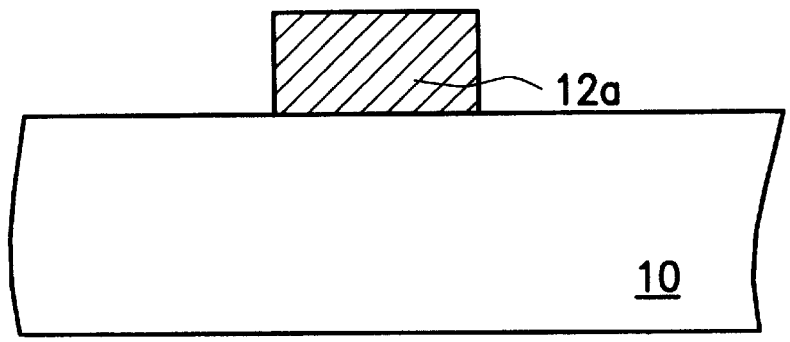

Next, referring to FIG. 1C, a wet strip process is performed to simultaneously remove the photoresist residue 18 remaining on the exposed surface of the metal layer 12*a* and the photoresist layer 14 formed on the metal layer 12*a*.

Without dry stripping by use of an $O_2$ plasma, the photoresist residue 18 cannot be oxidized into an insoluble oxide in a process of removing the photoresist layer 14 according to the invention. Consequently, the problem of difficulty in removing the photoresist residue 18 is resolved.

The features of the invention are described in the following.

(1) Corrosion of the metal layer is prevented by performing a heat treatment after patterning the metal layer and before removing the photoresist layer. This heat treatment removes all materials which can corrode the metal layer.

(2) Without using an oxygen plasma process, the photoresist residue remaining on the surface of the metal layer cannot be oxidized into an insoluble oxide. The photoresist residue therefore can be completely removed.

While the invention has been described by way of example and in terms of the preferred embodiment, it is to be understood that the invention is not limited to the disclosed embodiment. To the contrary, it is intended to cover various modifications and similar arrangements as would be apparent to those skilled in the art. Therefore, the scope of the appended claims should be accorded the broadest interpretation so as to encompass all such modifications and similar arrangement.

What is claimed is:

1. A method for removing photoresist in a metallization process, the method comprising the steps of:

providing a semiconductor substrate on which at least one MOS device has already been formed;

forming a metal layer on the semiconductor substrate;

forming a photoresist layer, on which a pattern is already defined, on the metal layer;

performing an etching process to transfer the pattern of the photoresist layer onto the metal layer;

performing a heat treatment to remove halogen ions that remain in the photoresist layer and metal halides on the surface of the metal layer after the etching process; and removing the photoresist layer by a wet strip process without using an oxygen plasma after the heat treatment, so that the photoresist layer is not oxidized into insoluble oxide.

2. The method for removing photoresist as claimed in claim 1, wherein said metal layer is an aluminum alloy layer.

3. The method for removing photoresist as claimed in claim 1, wherein the heat treatment is performed in an oven.

4. The method for removing photoresist as claimed in claim 1, wherein the heat treatment is performed on a hot plate.

5. The method for removing photoresist as claimed in claim 1, wherein the temperature of the heat treatment is about 120–150° C.

6. A method for removing photoresist in a metallization process, the method comprising the steps of:

providing a semiconductor substrate;

forming a metal layer on the semiconductor substrate;

forming a photoresist layer, on which a pattern is already defined, on the metal layer;

performing an etching process to transfer the pattern of the photoresist layer onto the metal layer by use of an etchant, after which a photoresist residue and a first residue remain on the exposed surface of the metal layer, and a second residue exists inside the photoresist layer;

performing a heat treatment to remove the first residue and the second residue; and performing a wet strip process without using an oxygen plasma after the heat treatment to remove the photoresist layer and the photoresist residue on the surface of the metal layer.

7. The method for removing photoresist in a metallization process as claimed in claim 6, wherein the first residue is a metal halide remaining after the etchant reacts with the metal layer in the etching process.

8. The method for removing photoresist in a metallization process as claimed in claim 6, wherein the second residue is a halogen ion remaining inside the photoresist layer after the etching process.

9. The method for removing photoresist in a metallization process as claimed in claim 6, wherein the heat treatment is performed in an oven.

10. The method for removing photoresist in a metallization process as claimed in claim 6, wherein the heat treatment is performed on a hot plate.

11. The method for removing photoresist in a metallization process as claimed in claim 6, wherein the temperature of the heat treatment is about 120–150° C.

* * * * *